United States Patent [19]

Numata

[11] 4,109,206
[45] Aug. 22, 1978

[54] SIGNAL STRENGTH METER DRIVE CIRCUIT

[75] Inventor: Tatsuo Numata, Tokyo, Japan

[73] Assignee: Pioneer Electronic Corporation, Tokyo, Japan

[21] Appl. No.: 807,611

[22] Filed: Jun. 17, 1977

[30] Foreign Application Priority Data

Jun. 17, 1976 [JP] Japan .................................. 51-70353

[51] Int. Cl.$^2$ ............................................. H04B 1/16
[52] U.S. Cl. .................................. 325/319; 325/364; 325/398; 325/455
[58] Field of Search ............... 325/319, 344, 364, 398, 325/363, 455, 405, 411, 413–415

[56] References Cited

U.S. PATENT DOCUMENTS

| | | | |
|---|---|---|---|
| 3,333,201 | 7/1967 | Hopengarten | 325/364 |
| 3,673,499 | 6/1972 | Avins et al. | 325/398 |
| 3,727,138 | 4/1973 | Traub | 325/455 |
| 3,748,582 | 7/1973 | Ohsawa | 325/455 |
| 3,753,120 | 8/1973 | Ohsawa | 325/455 |

*Primary Examiner*—Robert L. Griffin
*Assistant Examiner*—Marc E. Bookbinder
*Attorney, Agent, or Firm*—Sughrue, Rothwell, Mion, Zinn and Macpeak

[57] ABSTRACT

A signal strength meter drive circuit for a radio receiver or tuner comprises a bypass resistor $R_3$ connected in shunt with the output resistor $R_1$ of a mirror circuit for an IF amplifier output summing transistor $Q_{10}$ through a transistor $Q_{32}$ whose conduction is controlled by the biasing voltage for the circuit. The mirror circuit current drawn through the bypass resistor regulates the voltage drop across the output resistor, thus compensating for variations in the voltage characteristics of the various circuit elements, such as the Zener voltage, when they are incorporated in a monolithic IC chip.

8 Claims, 5 Drawing Figures

D.C. VOLTAGE ACROSS R₁ IN FIG. 1

ANTENNA INPUT LEVEL

D.C. VOLTAGE AT OUTPUT TERMINAL IN FIG. 1

ANTENNA INPUT LEVEL

D.C. VOLTAGE AT OUTPUT TERMINAL IN FIG. 2

ANTENNA INPUT LEVEL

SIGNAL STRENGTH METER DRIVE CIRCUIT

BACKGROUND OF THE INVENTION

1. Field of the Invention

This invention relates to a signal strength meter drive circuit for a radio receiver or tuner, capable of absorbing variations in the voltage characteristics of diodes, transistors, and the like formed in an Integrated Circuit (IC).

2. Description of the Prior Art

Conventionally, a diode level shifting circuit has been employed in the signal strength meter drive circuit of a radio receiver or tuner. When such a circuit is fabricated as an IC, however, variations in the voltage characteristics of the contained elements caused by temperature fluctuations and differences in the diffusing conditions are not compensated for, whereby when the amount of the level shift is large the meter may not indicate any output despite the fact that there is a sufficient antenna input, while when the amount of the level shift is small an offset in the meter output may occur.

The circuit diagram of a conventional signal strength meter is shown in FIG. 1, wherein an intermediate frequency amplifier $IF_1$ includes differential amplifier transistors $Q_{24}$ and $Q_{25}$, whose emitters are connected to a constant current source transistor $Q_{23}$. The output of amplifier $IF_1$ is half-wave rectified by a capacitor $C_1$ and transistors $Q_1$, $Q_2$ and $Q_3$. Similarly, the output of amplifier $IF_2$ is half-wave rectified by a capacitor $C_2$ and transistors $Q_4$, $Q_5$ and $Q_6$, and the output of amplifier $IF_3$ is half-wave rectified by a capacitor $C_3$ and transistors $Q_7$, $Q_8$ and $Q_9$. The collectors of $Q_3$, $Q_6$ and $Q_9$ are connected to the emitter of transistor $Q_{10}$, whose collector current thus represents the sum of the half-wave rectified outputs of amplifiers $IF_1$ to $IF_3$. Transistors $Q_{11}$ to $Q_{13}$ provide constant current biasing for $Q_1$ - $Q_9$. Transistors $Q_{14}$, $Q_{15}$ and $Q_{16}$ constitute a current mirror circuit, whereby the current flowing through a resistor $R_1$ is the same as the collector current of $Q_{10}$. The voltage across $R_1$ is thus proportional to the collector current of $Q_{10}$, and this voltage is level shifted by a circuit comprising transistors $Q_{17}$, $Q_{18}$, diode $D_1$ and a resistor $R_2$ to provide a signal strength meter output at terminal OUT.

The base biasing of $Q_{10}$ is stabilized by a circuit comprising transistors $Q_{19}$ to $Q_{22}$ and diodes $D_2$ to $D_5$, and the base of $Q_{20}$ is connected to the bases of $Q_{23}$, $Q_{26}$ and $Q_{29}$ to provide constant current biasing therefor.

In the above-described circuit, assuming that the voltage characteristic across resistor $R_1$ with respect to the antenna input level is designated by curve $f$ in FIG. 3, such characteristic will vary between curves $e$ and $g$ due to variations in the characteristics of transistors $Q_{19}$ to $Q_{22}$ and/or diodes $D_2$ to $D_5$ in the biasing circuit. When the Zener diode $D_3$ is formed in a monolithic IC, such variation is particularly pronounced and cannot be prevented. Consequently, the output voltage at terminal OUT varies as indicated in FIG. 4 between curves $e'$ and $g'$. For example, when the voltage across resistor $R_1$ has a characteristic as shown by curve $e$ in FIG. 3, the voltage characteristic at terminal OUT is as shown by curve $e'$ in FIG. 4. Thus, even if the antenna input level is zero, the meter is activated and indicates an output, which is termed "offset". Further, then the voltage characteristic of resistor $R_1$ is as shown by curve $g$ in FIG. 3 due to variation error, the circuit output voltage assumes the characteristic shown by curve $g'$ in FIG. 4, whereby the meter reads zero over a certain range when there is actually a small antenna input signal present. Even if the accuracies or characteristics of transistors $Q_{19}$ to $Q_{22}$, diodes $D_2$ to $D_5$, or capacitors $C_1$ to $C_3$ are enhanced so that the width between curves $e'$ and $g'$ in FIG. 4 is narrowed, variations in the characteristics of the active elements $Q_{17}$, $Q_{18}$ and $D_1$ would still tend to widen the gap between curves $e'$ and $g'$. Consequently, every circuit element would have to be highly accurate, and from a practical point of view this is extremely difficult and expensive.

SUMMARY OF THE INVENTION

Briefly, and in accordance with the present invention, a signal strength meter drive circuit for a radio receiver or tuner comprises a bypass resistor connected in shunt with the output resistor of a mirror circuit for an IF amplifier output summing transistor through a transistor whose conduction is controlled by the biasing voltage for the circuit. The mirror circuit current drawn through the bypass resistor regulates the voltage drop across the output resistor, thus compensating for variations in the voltage characteristics of the various circuit elements, such as the Zener voltage, when they are incorporated in a monolithic IC chip.

DETAILED DESCRIPTION OF THE PREFERRED EMBODIMENT

Figure 1:
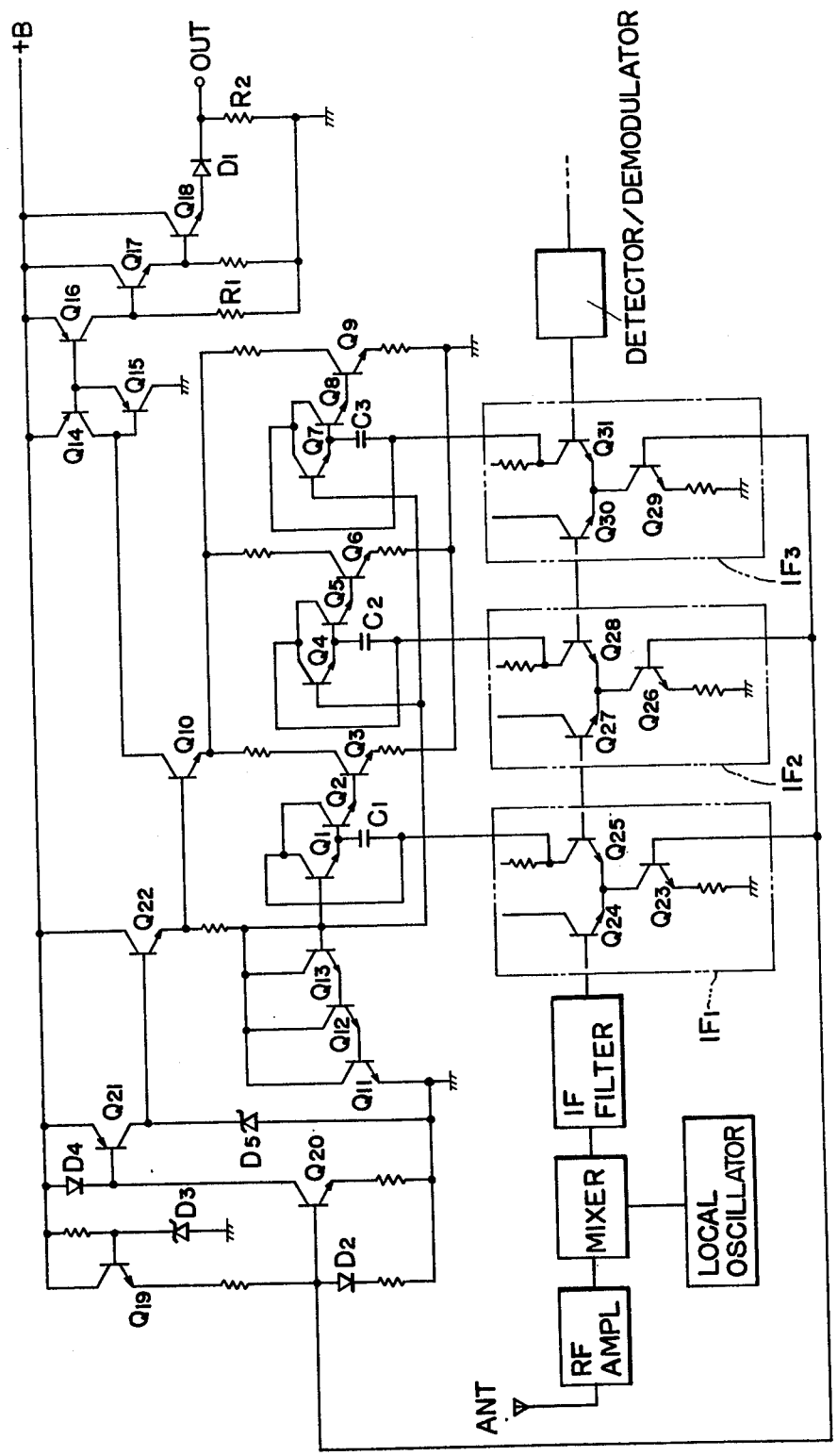
FIG. 1 shows a schematic diagram of a signal strength meter drive circuit according to the prior art.
Figure 2:
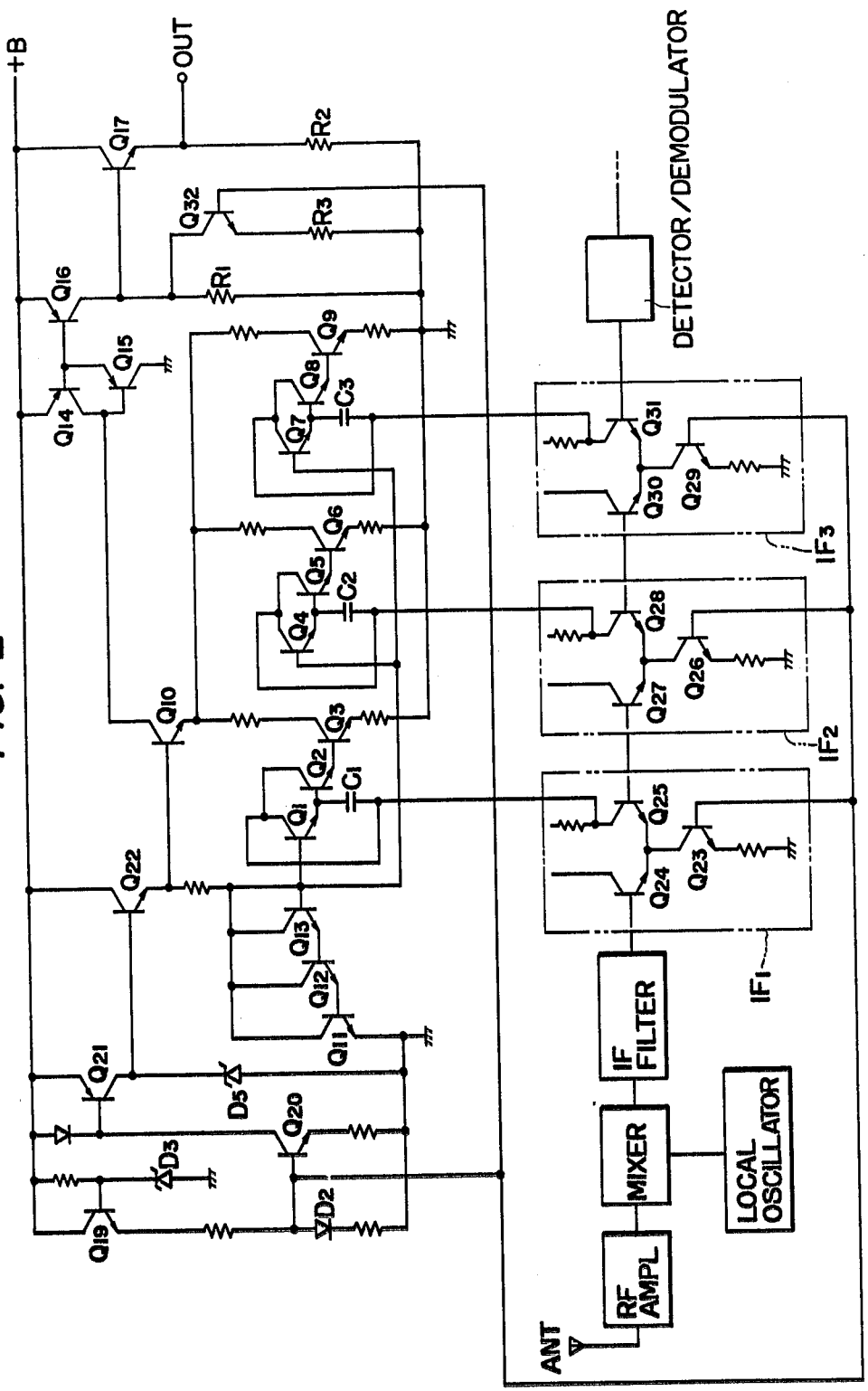
FIG. 2 shows a schematic diagram of such a drive circuit according to the present invention.
Figure 3:
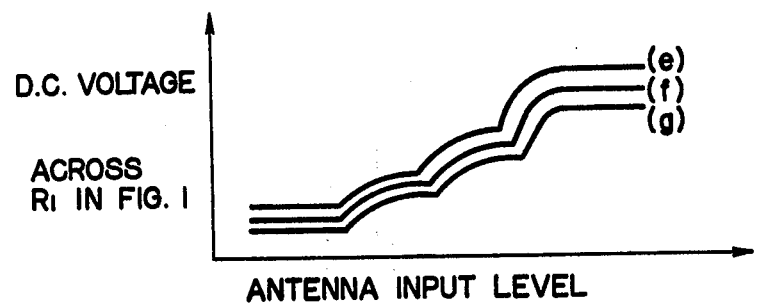
FIGS. 3, 4 and 5 show antenna input level vs. D.C. voltage characteristics at various points in the circuits of FIGS. 1 and 2.
Figure 4:
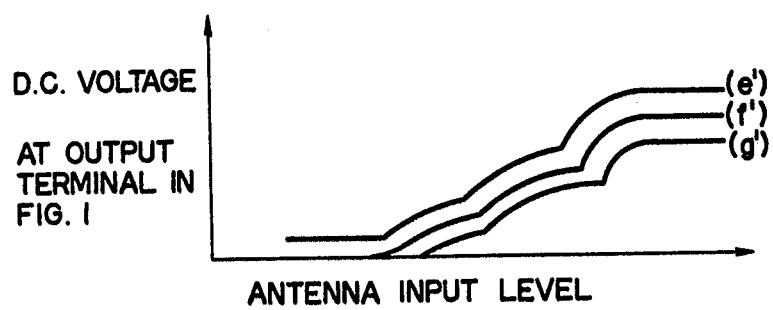

Referring to FIG. 2, the elements identical to those in FIG. 1 are designated by the same reference characters, and their description will not be repeated. A constant current circuit comprising transistor $Q_{32}$ and resistor $R_3$ is connected in parallel with resistor $R_1$, and operates as a shunt circuit with respect thereto. The base of transistor $Q_{32}$ is connected to the base of transistor $Q_{20}$, whereby the base biasing of transistor $Q_{32}$ is common to that of IF amplifiers $IF_1$ to $IF_3$.

If the base potential of transistor $Q_{19}$ increases due to a variation in the Zener diode $D_3$, the base potential of $Q_{20}$ also increases, which in turn increases the base biasing of the IF amplifiers $IF_1$ to $IF_3$. Thus, the IF outputs are increased and their summed output current in transistor $Q_{10}$ is increased, whereby the current through and voltage across resistor $R_1$ are correspondingly increased. By the provision of the shunt circuit comprising transistor $Q_{32}$ and resistor $R_3$, however, some of the current which would normally flow through resistor $R_1$ is shunted through resistor $R_3$, which thus subtracts from or reduces the current flowing through $R_1$. The amount of such reduction is of course proportional to the conduction level of $Q_{32}$, which in turn is proportional to any variation in the voltage level or characteristic of $D_3$. Consequently, variations in the Zener diode $D_3$ are compensated for or absorbed. Further, since the level shifting circuit in FIG. 2 comprises only one transistor $Q_{17}$, output fluctuations due to variations produced by the level shifting circuit are decreased.

Figure 5:
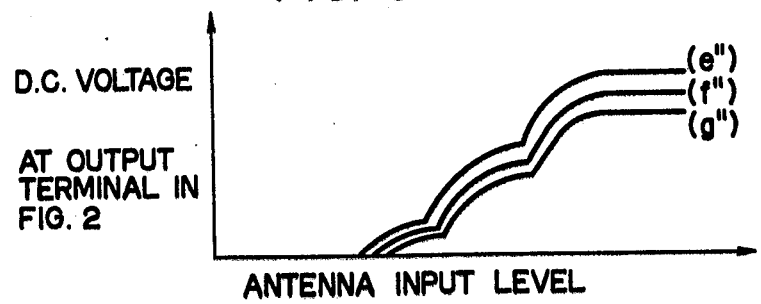

According to the present invention, the width of the variations in the voltage characteristic across resistor $R_1$ substantially narrowed, particularly when the antenna input level is low, as can be seen from the separation between curves $e''$ and $g''$ in FIG. 5. Accordingly, the fidelity of the signal strength meter indication is enhanced, thus compensating for drive circuit drift when the circuit elements are formed in an IC chip, or the like.

What is claimed is:

1. In a signal strength meter drive circuit for a radio receiver or tuner including a plurality of intermediate frequency amplifiers, means for rectifying the outputs of said amplifiers, amplifier means for summing said rectified outputs, said amplifier means including a load resistor, an output circuit for shifting the level of the voltage across said load resistor for driving said meter, and circuit means for supplying biasing voltages to the above circuit components, the improvement characterized by:

shunt circuit means connected in parallel with said load resistor and including variable conduction means controlled by said biasing circuit means, whereby said shunt circuit means draws off a proportion of said load resistor current to thereby compensate for variations in the voltage characteristics of the various circuit components.

2. A drive circuit as defined in claim 1, wherein said shunt circuit means comprises a resistor and a transistor connected in series.

3. A drive circuit as defined in claim 1, wherein said biasing circuit means comprises at least one Zener diode, and at least some of said circuit components are incorporated in a monolithic integrated circuit.

4. A drive circuit as defined in claim 2, wherein said biasing circuit means comprises at least one Zener diode, and at least some of said circuit components are incorporated in a monolithic integrated circuit.

5. A drive circuit as defined in claim 1, wherein said summing amplifier means comprises a summing amplifier and a mirror circuit therefor, and said load resistor is connected in the output of said mirror circuit.

6. A drive circuit as defined in claim 2, wherein said summing amplifier means comprises a summing amplifier and a mirror circuit therefor, and said load resistor is connected in the output of said mirror circuit.

7. A drive circuit as defined in claim 3, wherein said summing amplifier means comprises a summing amplifier and a mirror circuit therefor, and said load resistor is connected in the output of said mirror circuit.

8. A drive circuit as defined in claim 4, wherein said summing amplifier means comprises a summing amplifier and a mirror circuit therefor, and said load resistor is connected in the output of said mirror circuit.

* * * * *